United States Patent
Yamashita et al.

(10) Patent No.: US 11,329,201 B2
(45) Date of Patent: May 10, 2022

(54) LIGHT-EMITTING DEVICE

(71) Applicant: NICHIA CORPORATION, Anan (JP)

(72) Inventors: Ryohei Yamashita, Tokushima (JP); Yusaku Achi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/832,004

(22) Filed: Dec. 5, 2017

(65) Prior Publication Data

US 2018/0159002 A1 Jun. 7, 2018

(30) Foreign Application Priority Data

Dec. 6, 2016 (JP) .............................. JP2016-236369

(51) Int. Cl.
| | |
|---|---|
| *H01L 33/58* | (2010.01) |
| *H01L 33/52* | (2010.01) |
| *H01L 33/36* | (2010.01) |
| *H01L 33/54* | (2010.01) |

(52) U.S. Cl.
CPC .............. *H01L 33/58* (2013.01); *H01L 33/36* (2013.01); *H01L 33/52* (2013.01); *H01L 33/54* (2013.01); *H01L 2224/73204* (2013.01)

(58) Field of Classification Search
None
See application file for complete search history.

(56) References Cited

U.S. PATENT DOCUMENTS

| | | | | |
|---|---|---|---|---|
| 8,723,195 | B2* | 5/2014 | Ishizaki | ................. H01L 33/56 257/88 |
| 2005/0281303 | A1 | 12/2005 | Horio et al. | |
| 2008/0145961 | A1 | 6/2008 | Horio et al. | |
| 2009/0140271 | A1* | 6/2009 | Sah | ........................ F21V 31/04 257/88 |
| 2012/0139445 | A1 | 6/2012 | Fujiwara et al. | |
| 2012/0218318 | A1 | 8/2012 | Hirao et al. | |
| 2013/0043504 | A1* | 2/2013 | Kobayakawa | ........ H01L 33/647 257/99 |
| 2013/0075776 | A1 | 3/2013 | Murai et al. | |
| 2013/0187179 | A1* | 7/2013 | Tan | ........................ H01L 33/54 257/98 |
| 2013/0240942 | A1 | 9/2013 | Inoue et al. | |
| 2013/0285090 | A1 | 10/2013 | Furuyama et al. | |
| 2014/0048821 | A1 | 2/2014 | Inoue et al. | |
| 2015/0001564 | A1 | 1/2015 | Oguro et al. | |
| 2015/0036317 | A1 | 2/2015 | Yamamoto et al. | |
| 2015/0255039 | A1 | 9/2015 | Hirao et al. | |

(Continued)

FOREIGN PATENT DOCUMENTS

| | | |
|---|---|---|
| JP | 2002-305328 A | 10/2002 |
| JP | 2003-110144 A | 4/2003 |

(Continued)

*Primary Examiner* — Nishath Yasmeen
(74) *Attorney, Agent, or Firm* — Foley & Lardner LLP (57) ABSTRACT

A light-emitting device includes: a substrate; and at least one light source comprising: a light-emitting element comprising a plurality of electrodes that face the substrate, and a resin member covering at least portions of lateral surfaces of the light-emitting element and not covering an upper surface of the light-emitting element, wherein, in a directivity diagram of the light source, a variation in light output of the light source in a range of −40° to 40° is 15% or less.

13 Claims, 8 Drawing Sheets

(56) References Cited

U.S. PATENT DOCUMENTS

| | | | | |
|---|---|---|---|---|
| 2015/0338069 A1* | 11/2015 | Tamura | ............... | F21V 23/06 |
| | | | | 362/249.04 |
| 2016/0093780 A1* | 3/2016 | Beppu | ............. | H01L 21/3213 |
| | | | | 257/98 |
| 2016/0349445 A1* | 12/2016 | Kim | ................... | H01L 33/56 |
| 2017/0012027 A1 | 1/2017 | Maki | | |
| 2017/0236806 A1 | 8/2017 | Hirao et al. | | |
| 2019/0221551 A1 | 7/2019 | Hirao et al. | | |

FOREIGN PATENT DOCUMENTS

| | | | |
|---|---|---|---|
| JP | 2006-005215 A | | 1/2006 |
| JP | 2007-317423 | * | 12/2007 |
| JP | 2007-317423 A | | 12/2007 |
| JP | 2008-103200 A | | 5/2008 |
| JP | 2008-117538 A | | 5/2008 |
| JP | 2009-218274 A | | 9/2009 |
| JP | 2012-054422 A | | 3/2012 |
| JP | 2012-175066 A | | 9/2012 |
| JP | 2013-232479 A | | 11/2013 |
| JP | 2014-075571 A | | 4/2014 |
| JP | 2015-012206 A | | 1/2015 |
| JP | 2015-032373 A | | 2/2015 |
| WO | WO-2011/024498 A | | 3/2011 |
| WO | WO-2012/004975 A1 | | 1/2012 |
| WO | WO-2013/076896 A1 | | 5/2013 |
| WO | WO-2013/111542 A1 | | 8/2013 |
| WO | WO-2014050655 | * | 9/2013 |
| WO | WO 2014050655 | * | 9/2013 |
| WO | WO-2013/145054 A1 | | 10/2013 |
| WO | WO-2016-047132 A1 | | 3/2016 |

* cited by examiner

LIGHT-EMITTING DEVICE

CROSS-REFERENCE TO RELATED APPLICATIONS

This application claims priority to Japanese Patent Application No. 2016-236369 filed on Dec. 6, 2016, the disclosure of which is hereby incorporated by reference in its entirety.

BACKGROUND OF THE INVENTION

1. Field of the Invention

The present disclosure relates to a light-emitting device.

2. Description of Related Art

Generally, light-emitting devices including light-emitting elements such as light-emitting diodes are widely used for backlights for liquid-crystal display devices and for various light sources for display devices and the like. For example, a light-emitting device described in Japanese Unexamined Patent Application Publication No. 2015-32373 includes a plurality of light-emitting elements mounted on a mounting board, and hemispherical lens members respectively sealing the light-emitting elements.

However, each of the light-emitting elements in the light-emitting device disclosed in Japanese Unexamined Patent Application Publication No. 2015-32373 tends to exhibit a hemispherical light distribution (what is called a Lambertian light distribution), which may lead to difference in luminance between a region directly above each of the light-emitting elements and a region between adjacent light-emitting elements. Also, in such a light-emitting device including lens members as disclosed in Japanese Unexamined Patent Application Publication No. 2015-32373, distance between the mounting board and a diffuser needs be greater than a thickness of each of the lens members. Accordingly, reduction in thickness of the light-emitting device may not be achieved.

In view of the above, the present disclosure has an object to provide a light-emitting device in which unevenness in luminance can be reduced.

SUMMARY OF THE INVENTION

A light-emitting device according to the present disclosure includes a substrate and at least one light source. The light source includes a light-emitting element including a plurality of electrodes disposed on a surface of the light-emitting element such that the plurality of electrodes face the substrate, and a resin member covering lateral surfaces of the light-emitting element and not covering an upper surface of the light-emitting element. In a directivity diagram of the light source, a variation in light output of the light source in a range of −40° to 40° is 15% or less.

The present disclosure enables a light-emitting device that exhibits reduced unevenness in luminance to be provided.

DETAILED DESCRIPTION

Embodiments of the present disclosure are described below in detail with reference to the accompanying drawings. The descriptions below include terms indicating directions or positions (for example, "up", "down", and other terms inclusive of these terms) as appropriate. Use of these terms is, however, intended to facilitate understanding of the disclosed embodiments with reference to the drawings, and the meanings of these terms do not limit the technical scope of the present invention.

The same reference numeral in a plurality of drawings indicates the same or similar portion or member. Embodiments described below are intended to exemplify a light-emitting device to give a concrete form to the technical ideas of the concepts described herein, and the present invention is not limited to the below embodiments. Unless otherwise specifically stated, descriptions of sizes, materials, shapes, and relative positions of constituent components below are not intended to limit the scope of the present invention thereto, but rather are intended to describe examples thereof. Sizes or positional relationships of members illustrated in the drawings may be exaggerated for ease of understanding.

Liquid-Crystal Display Apparatus 1000

Figure 1:
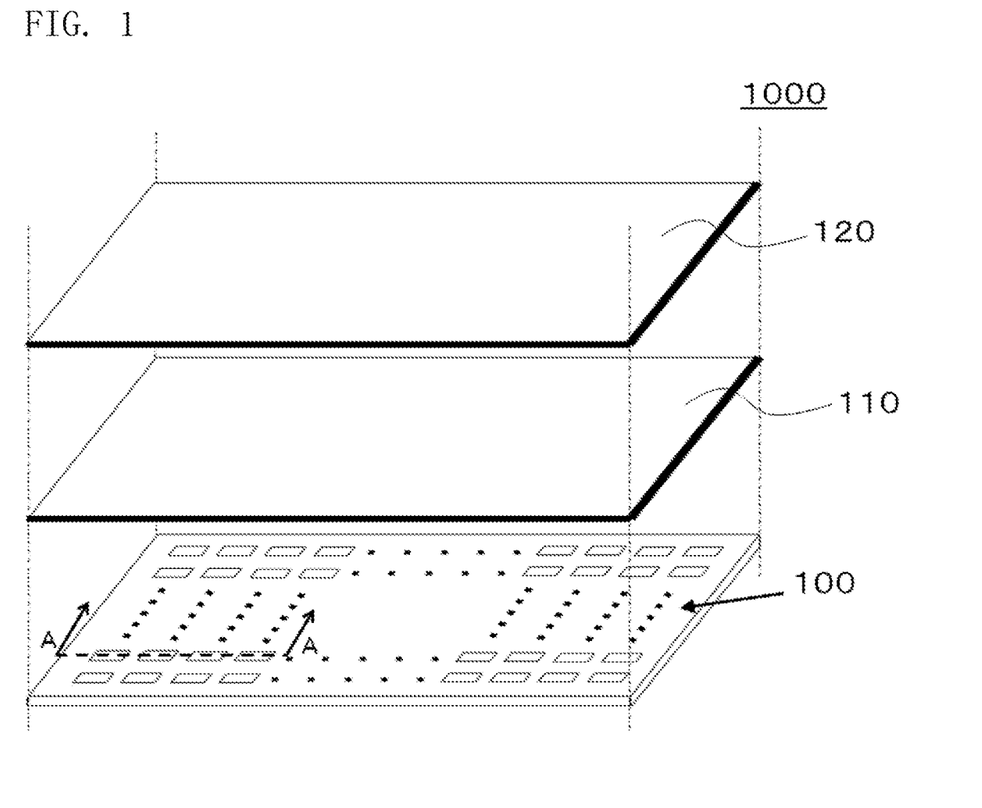
FIG. 1 schematically illustrates the structure of a liquid-crystal display apparatus in the present disclosure.

FIG. 1 schematically illustrates the structure of a liquid-crystal display apparatus 1000.

The liquid-crystal display apparatus 1000 shown in FIG. 1 includes a liquid-crystal panel 120, an intermediate layer 110, and a light-emitting device 100 in order from an upper side thereof. The liquid-crystal display apparatus 1000 is a direct-lit liquid-crystal display apparatus in which the light-emitting device 100 is disposed below the liquid-crystal panel 120. In the liquid-crystal display apparatus 1000, light emitted from the light-emitting device 100 is subjected to diffusion and wavelength conversion by a diffuser and a phosphor sheet in the intermediate layer 110 and is emitted to the liquid-crystal panel 120. The liquid-crystal display apparatus 1000 also include other members such as a polarizing film and a color filter, although illustration of these members is omitted in FIG. 1.

Light-Emitting Device 100

Figure 2:
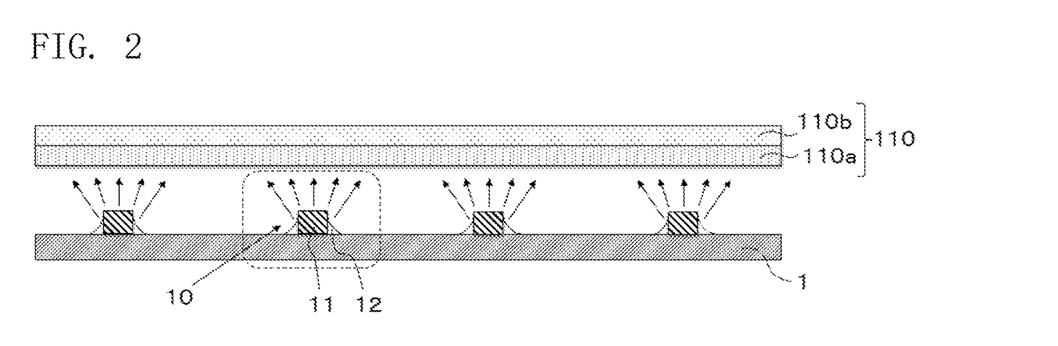
FIG. 2 is a schematic cross-sectional view of a light-emitting device and an intermediate layer taken along the line A-A in FIG. 1.

FIG. 2 is a schematic cross-sectional view of the light-emitting device 100 and the intermediate layer 110 taken along the line A-A in FIG. 1. The light-emitting device 100 includes a substrate 1 and a plurality of light sources 10 mounted on the substrate 1. The light sources 10 are arranged in a matrix on the substrate 1. The light-emitting device 100 is configured to irradiate a diffuser 110a and a phosphor sheet 110b with light in a plane. Because the distance between the liquid-crystal panel and each of light-emitting devices are short in direct-lit liquid-crystal display apparatuses, unevenness in luminance of the light-emitting devices may affect unevenness in luminance of the liquid-crystal display apparatuses. Accordingly, light-emitting devices with less unevenness in luminance are desired to be used as light-emitting devices for direct-lit liquid-crystal display apparatuses. The light-emitting device 100 in certain embodiments of the present disclosure includes the light sources 10 having specific directional characteristics, so that unevenness in luminance of the light-emitting device 100 can be reduced.

Substrate 1

Figure 3:
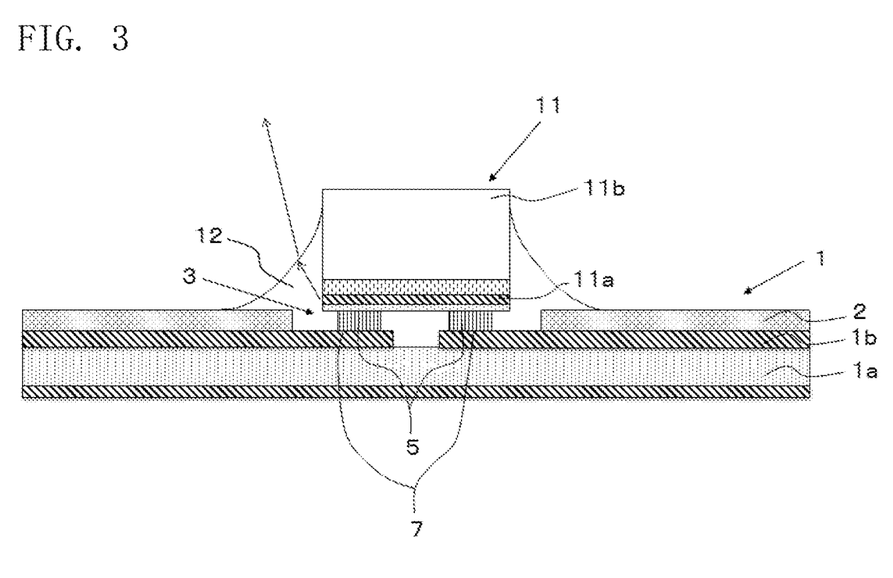
FIG. 3 is a schematic enlarged view of a portion indicated by the dashed line in FIG. 2 and illustrates details of a light source and a substrate.

The substrate 1 is a circuit board on which the light sources 10 are mounted and to which the light sources 10 are electrically connected. FIG. 3 is a schematic enlarged view of a portion indicated by the dashed line in FIG. 2 and illustrates details of the substrate 1 and one of the light sources 10. Sizes or positional relationships of members may be exaggerated for ease of understanding. In the substrate 1, wiring layers 1b are formed on a base member 1a, and an insulating member 2 is formed so that portions of the wiring layers 1b used for mounting are exposed. The base member 1a constitutes the body material (i.e., base film) of the substrate 1 and is made of, for example, a flexible, thin, plate-like insulating member.

Each of the wiring layers 1b is an electrically conductive foil (i.e., conductor layer) disposed on the base member 1a and is electrically connected to a plurality of light-emitting elements 11. Any appropriate conductive material may be used for the wiring layers 1b. A material of the wiring member preferably has a high thermal conductivity. Examples of such a material include electrically conductive materials such as copper. The wiring layers 1b can be formed by plating, application of an electrically conductive paste, printing, or the like. Each of the wiring layers 1b has a thickness of, for example, about 5 μm to 50 μm. To reduce the weight of the substrate 1, holes extending between the upper surface and the lower surface may be defined in the wiring layers 1b in regions other than regions connected to the light sources 10.

The insulating member 2 is disposed on the wiring layers 1b and serves as a reflective member that reflects light emitted from the light-emitting element 11 and returned light. A plurality of openings 3 are defined in the insulating member 2. Portions of the wiring layers 1b are respectively located on the bottom of respective one of the openings 3, and the surface of the wiring layers 1b at the bottom of each of the openings 3 corresponds to the portion on which respective one of the light-emitting elements is mounted. The insulating member 2 can be made of, for example, a member having a color same as the color of light to be emitted from the light-emitting element 11 (for example, a blue insulating member in the case of using a blue light-emitting element), a material that reflects light in a region corresponding to the emission wavelengths of the light-emitting element 11 or a wavelength conversion member, or a white material. This structure allows for enhancing light output of the light-emitting device 100. For example, a mixture of a silicone resin mixed with a material such as titanium oxide or silicon oxide can be used for the insulating member 2.

Light Source Unit 10

Each of the light sources 10 includes the light-emitting element 11 and a resin member 12 covering lateral surfaces of the light-emitting element 11 and not covering the upper surface of the light-emitting element 11. The light-emitting element 11 includes, on a surface thereof, a plurality of electrodes 5 facing the substrate 1. The light-emitting element 11 is electrically connected to the substrate 1 via bonding members 7.

The light-emitting element 11 includes a light-transmissive substrate 11b and a semiconductor layered structure layered on the light-transmissive substrate 11b. The semiconductor layered structure includes a light-emitting layer 11a and n-type and p-type semiconductor layers on both sides of the light-emitting layer 11a. The n-type and p-type semiconductor layers are electrically connected to n-side and p-side electrodes, respectively. The n-side and p-side electrodes are located at a surface of the light emitting element 11 opposite to an emission surface thereof. The n-side and p-side electrodes are electrically connected and fixed to the wiring layers 1b disposed on the upper surface of the substrate 1 via the bonding members 7. That is, the light-emitting element 11 includes, at one surface, the plurality of electrodes 5 facing the substrate 1. In other words, the light-emitting element 11 is flip-chip bonded to the substrate 1.

The light-emitting element 11 may have any appropriate dimensions of length, width, and height. A light-emitting element having a length and a width of respectively 250 μm or less each, more preferably 80 μm or less each, in a plan view, is preferably used. With such a light-emitting element, high-definition images can be obtained through local dimming of the liquid-crystal display apparatus. It is known that a light-emitting element having a length and a width of 250 μm or less each has a batwing light distribution. Accordingly, such a light-emitting element with a hemispherical lens member disposed thereon provides a batwing distribution of light that has passed through the lens member. Such a light distribution may lead to unevenness in luminance of light emitted from the light-emitting device 100. Employing a lens member having a complex shape allows a depression in a batwing light distribution curve to be reduced, but may lead to difficulty in reduction in thickness of the light-emitting device. Also, using a plurality of lens members corresponding to a plurality of light-emitting elements may raise costs. In the light-emitting device of certain embodiments of the present disclosure, the resin member 12 is disposed on lateral surfaces of the light-emitting element 11, so that light emitted from the lateral surfaces of the light-emitting element 11 can be emitted upward through the resin member 12. Accordingly, a depression in the light distribution curve in a region directly above the light source 10 and its vicinities (for example, −40° to 40° based on the position directly above the center of the light-emitting element) can be reduced even in the case where a light-emitting element having a length and a width of 250 μm or less each is used.

It is preferable that a light-emitting element having an elongated rectangular shape in a plan view be used for the light-emitting element 11. In other words, the light-emitting element 11 preferably has long sides and short sides. For a high-definition liquid-crystal display apparatus, some thousand or more light-emitting elements 11 are used, and mounting of the light-emitting elements 11 is therefore important. With light-emitting elements each having an elongated rectangular shape in a plan view, if rotational offset (for example, offset in ±90° directions) occurs in the arrangement of the light-emitting elements, such rotational offset can be easily detected by visual observation.

Figure 4A:
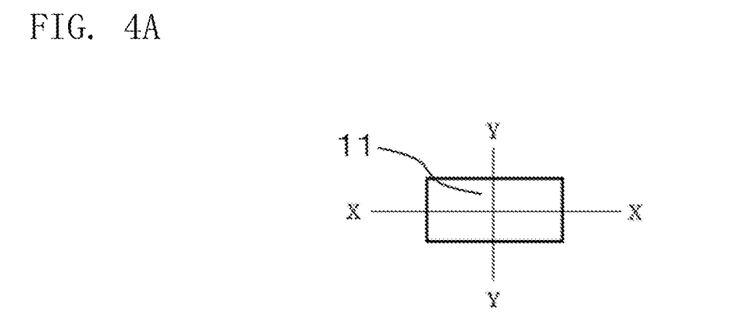
FIG. 4A is a schematic plan view for illustrating directions of a light-emitting element.
Figure 4B:
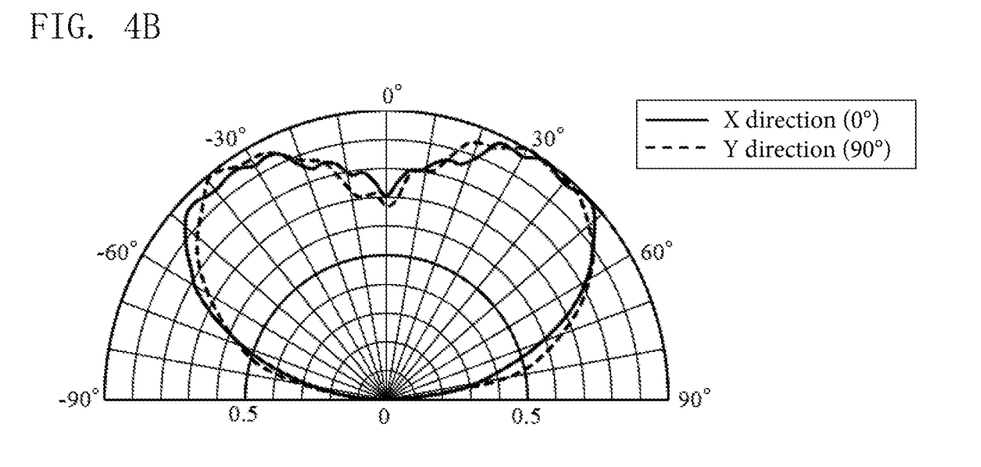
FIG. 4B is a directivity diagram showing an example of light distribution properties of light emitted from the light-emitting element.

FIG. 4A and FIG. 4B show an example of light distribution properties of light emitted from the light-emitting element 11. FIG. 4A is a schematic plan view for illustrating directions of the light-emitting element 11. FIG. 4B is a directivity diagram showing one example of light distribution properties of light emitted from the light-emitting element 11. The light-emitting element 11 in FIG. 4A and FIG. 4B has a length and a width of 250 μm or less each in a plan view and has a batwing light distribution. In the batwing light distribution of the light-emitting element 11, the amount of light directly above the light-emitting element 11 is reduced, which may lead to difference in luminance between a region directly above the light-emitting element 11 and a region other than that region. In the light-emitting device in the present disclosure, the resin member 12 disposed on the lateral surfaces of the light-emitting element 11 allows for increasing the amount of light above the light-emitting element. Accordingly, unevenness in luminance of the light-emitting device is reduced even in the case where the light-emitting device performs surface irradiation. In a broad sense, a batwing light distribution refers to an emission intensity distribution in which a light distribution angle is present which has an absolute value greater than 0 and at which an emission intensity is higher than an emission intensity at a light distribution angle of 0°, which refers to the optical axis of the light source 10. In particular, in a narrow sense, a batwing light distribution is referred to as an emission intensity distribution in which the emission intensity is the highest at a light distribution angle in a range of about 45° to 90°. That is, in a batwing light distribution, brightness in the central region is lower than that in the outer region.

Referring back to FIG. 3, the resin member 12 will be described. The resin member 12 of the light-emitting device 100 is a light-transmissive member. The light-transmissive resin member 12 (hereinafter may be referred to as a light-transmissive member 12) transmits 60% or more, preferably 90% or more, of light emitted from the light-emitting element. The light-transmissive member 12 serves to propagate light laterally emitted from the light-emitting element 11 upward. Accordingly, while the light-transmissive member 12 can contain a diffusing member and the like, the light-transmissive member 12 is preferably made of only a resin material free of the diffusing member or the like. The light-transmissive member 12 preferably covers the light-emitting layer 11a of the light-emitting element 11. In other words, a portion of the light-transmissive member 12 is preferably located at a position higher than a position of the light-emitting layer 11a of the light-emitting element 11 in a height direction. This structure allows light laterally emitted from the light-emitting layer to be efficiently propagated through the light-transmissive member 12.

The light-transmissive member 12 preferably covers at least a portion of the light-transmissive substrate 11b of the light-emitting element 11. This structure allows a portion of light emitted from the light-emitting layer 11a laterally through the light-transmissive substrate 11b to be extracted upward. The light-transmissive member 12 preferably covers a half or more of each of the lateral surfaces of the light-transmissive substrate 11b in the height direction. As will be described below, it is preferable that the light-transmissive member 12 do not cover the entirety of the lateral surfaces of the light-transmissive substrate 11b so that the upper surface of the light-emitting element 11 is not covered by the light-transmissive member 12. That is, the light-transmissive member 12 is preferably disposed, in the height direction, between the middle of each of the lateral surfaces of the light-transmissive substrate 11b and the upper surface of the light-transmissive substrate 11b (excluding the upper surface).

At least a portion of the upper surface of the light-emitting element 11 is exposed from the light-transmissive member 12, and the entirety of the upper surface of the light-emitting element 11 is preferably exposed. In other words, the light-transmissive member 12 preferably does not cover the upper surface of the light-emitting element 11. This structure allows for preventing the light distribution directly above the light source 10 from having a convex shape due to a lens effect of the light-transmissive member 12.

Figure 5:
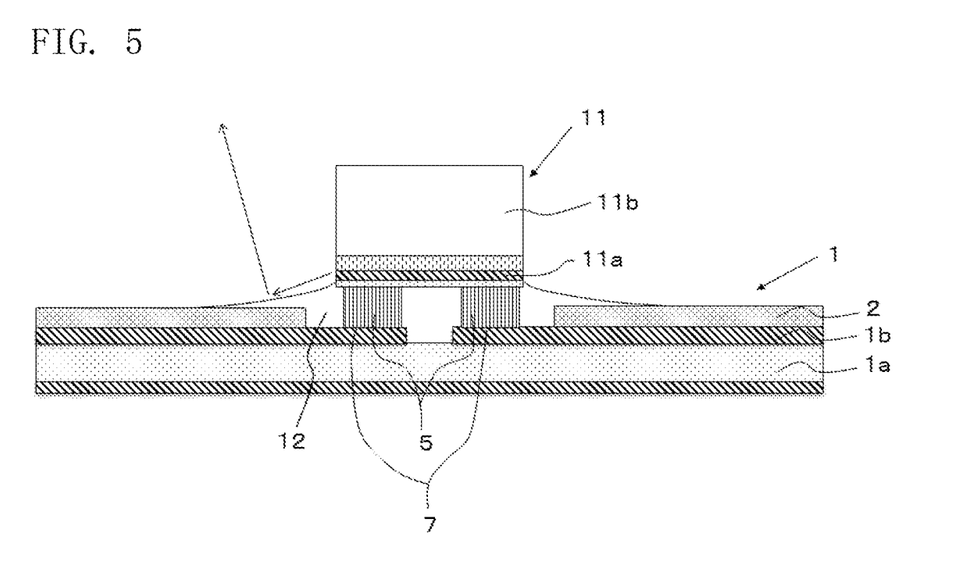
FIG. 5 is a schematic cross-sectional view of another form of a resin member.

FIG. 5 shows another form of the resin member 12. The resin member 12 shown in FIG. 5 is located at a position lower than a position of the light-emitting layer 11a in the height direction. In other words, the resin member 12 does not cover the light-emitting layer 11a. This structure allows light emitted from the light-emitting element 11 to be reflected on a surface of the resin member 12. For the resin member 12 shown in FIG. 5, for example, a reflective resin member is used. The reflective resin member 12 has a reflectance of 60% or more, preferably 90% or more, for light emitted from the light-emitting element. In the light source 10 shown in FIG. 5, a height of the plurality of electrodes 5 of the light-emitting element 11 is increased so that the light-emitting layer 11a is located at a high position, but the light-emitting layer 11a of the light-emitting element 11 may be located at a high position by using a submount instead. In the case where the submount is used, the substrate 1 includes the submount.

Directional Characteristics of Light Source Unit 10

FIG. 6A to FIG. 8 show three examples of directional characteristics of the light source 10 suitable for the light-emitting device 100.

Figure 6A:
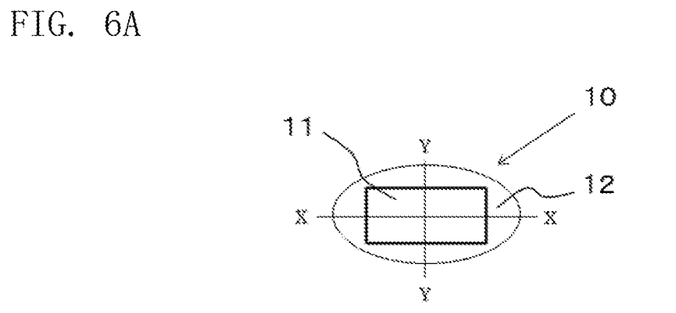
FIG. 6A is a schematic plan view for illustrating directions of the light source.
Figure 6B:
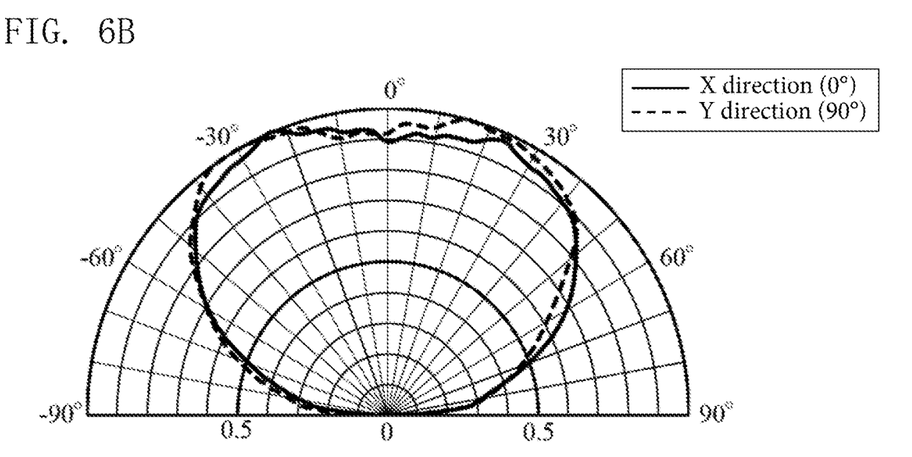
FIG. 6B is a directivity diagram illustrating an example of properties of the light source.

FIG. 6A and FIG. 6B are directivity diagrams illustrating a first characteristic of the light source 10 suitable for the light-emitting device 100. The solid line represents the directional characteristic in the X direction of the light source 10 shown in FIG. 6A, and the dashed line represents the directional characteristic in the Y direction of the light source 10 shown in FIG. 6A. The directional characteristics of the light source 10 can be provided by, for example, simulating one light source 10 mounted on the substrate 1. In FIG. 6B, the vertical axis indicates the light output ratio, and the highest light output value of the light output values in each of the X direction and the Y direction of the light source 10 is referred to as a light output ratio of 100% of respective one of the X direction and the Y direction of the light source 10. The values outside the graph (i.e., values −90° to 90°) represent light distribution angles, and "0°" indicates a direction toward directly above the center of the light source.

As shown in the directivity diagram in FIG. 6B, the variation in light output of the light source 10 is 15% or less in the range of −40° to 40°. The variation in light output of the light source 10 is 15% or less preferably in the range of −45° to 45°, more preferably in the range of −60° to 60°. In other words, the expression "variation in light output of the light source 10 is 15% or less in the range of −40° to 40°" refers to that the lowest light output ratio in the range of −40° to 40° is 85% or more when the highest value of the light output of the light source 10 is assumed to be a light output ratio of 100%. In the present specification, the expression "variation in light output in a range of $\alpha°$ to $\beta°$" refers to variation in light output in the entire range of $\alpha°$ to $\beta°$. In the light source 10 having the first characteristic, light emitted to a region above the light source 10 (for example, a region where light is emitted at the light distribution angle in a range of −40° to 40°) has a substantially uniform luminance. Accordingly, in the light-emitting device 100 including a plurality of light sources 10 having such a characteristic, unevenness in luminance of light emitted can be reduced when planar irradiation is performed.

Figure 7A:
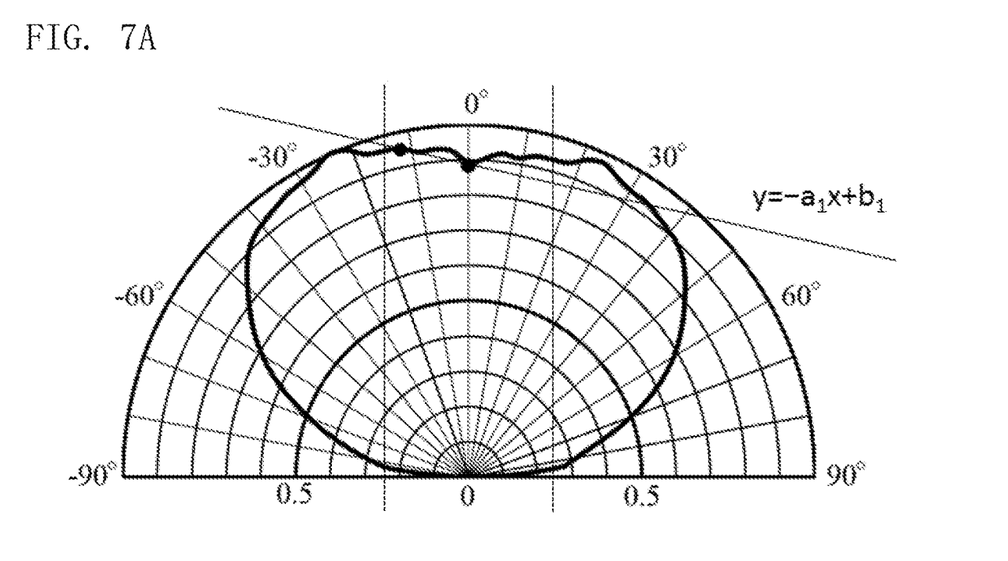
FIG. 7A is a directivity diagram illustrating an example of the properties of the light source.
Figure 7B:
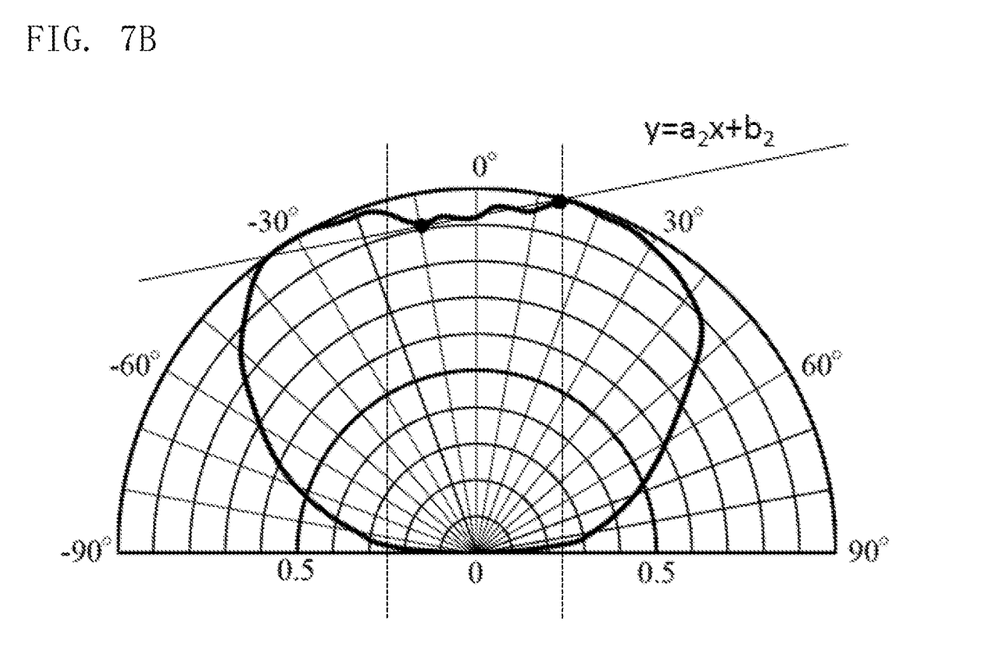
FIG. 7B is a directivity diagram illustrating an example of the properties of the light source.

FIG. 7A and FIG. 7B schematically illustrate a second characteristic of the light source 10 suitable for the light-emitting device 100. FIG. 7A is a directivity diagram showing the directional characteristic in the X direction of the light source 10. FIG. 7B is a directivity diagram showing the directional characteristic in the Y direction of the light source 10. As shown in FIG. 7A and FIG. 7B, in the directivity diagram of the light source 10, the slope a of a straight line passing through the maximum and minimum values of y (i.e., $y=-a_1x+b_1$ in FIG. 7A, and $y=a_2x+b_2$ in FIG. 7B) on the curve in the range of −15° to 15° is in the range of −0.3 to 0.3. With such a light source 10, unevenness in luminance of light emitted from the light-emitting device 100 can be reduced. The slope a is preferably in a range of −0.3 to 0.3 at a light distribution angle in the range of −30° to 30°, more preferably in the range of −45° to 45°.

Figure 8:
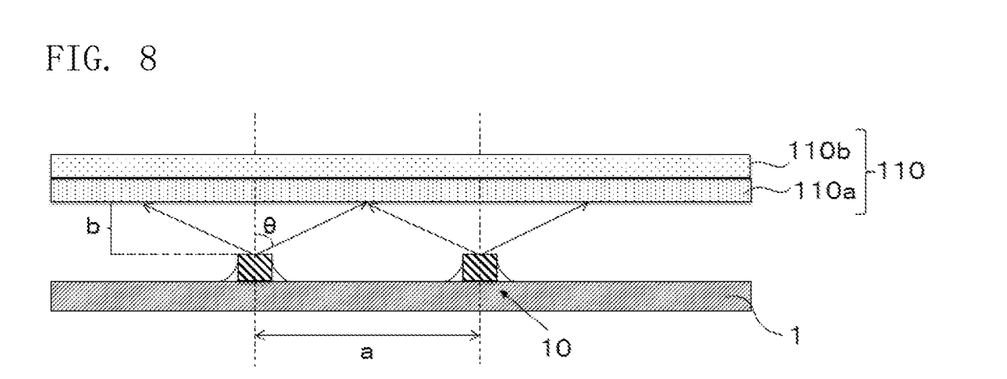
FIG. 8 schematically illustrates an example of the properties of the light source.

FIG. 8 schematically illustrates a third characteristic of each of the light sources 10 suitable for the light-emitting device 100. As shown in FIG. 8, variation in light output of each of the light sources 10 is 15% or less at a light distribution angle in a range of −θ to θ satisfying the condition below. The smallest values of the lower and upper limits of the range of −θ to θ contain deviation of ±5°. The light distribution angle θ satisfies tan θ=a/2b, where a represents a intervals between the light-emitting element 11 of each of the light sources 10 and the light-emitting element 11 of adjacent one of the light sources 10, and b represents the distance between the upper surface of the light-emitting element 11 of a respective one of the light sources 10 and the intermediate layer 110. With such light sources 10, light emitted from a light-emitting element 11 of each of the light sources 10 and light emitted from the light-emitting element 11 of adjacent one of the light sources 10 can be prevented from overlapping with each other, so that increase in brightness of regions where such overlapping occurs compared with the other region can be prevented. Accordingly, unevenness in luminance of light emitted from the light-emitting device 100 can be reduced.

The light source 10 may have one of the first characteristic of the light source described referring to FIG. 6A and FIG. 6B, the second characteristic of the light source described referring to FIG. 7A and FIG. 7B, and the third characteristic of the light source described referring to FIG. 8, or the light source may have two or more of these characteristics.

Components of the light-emitting device 100 according to one embodiment of the present invention will be described below.

Substrate

The substrate 1 is a circuit board including wiring layers (i.e., electrically conductive portion) through which electricity is supplied from outside to the light sources 10 mounted on the wiring layers 1b. The substrate 1 includes at least the base member 1a and the wiring layers 1b. The substrate 1 in the present embodiment is a mounting board for a direct backlight to be disposed facing the liquid-crystal panel 120. The substrate 1 may a flexible substrate that can be manufactured by roll-to-roll method, or a rigid substrate. The substrate 1 can have any appropriate thickness.

The base member 1a serves as a base of the substrate 1. Examples of a material of the base member 1a include ceramics and resins. A resin may be selected for a material for the base member 1a in view of low cost and easiness in formation. Examples of such a resin include phenolic resins, epoxy resins, polyimide resins, BT resins, polyphthalamide (PPA), poly(ethylene terephthalate) (PET), and unsaturated polyesters.

A ceramic may be selected for a material of the base member 1a because of its good resistance to heat and light. Examples of such ceramic include alumina, mullite, forsterite, glass ceramics, and nitride (for example, AlN) and carbide (for example, SiC) ceramics.

The base member 1a may be made of a composite material such as a mixture of the above-mentioned resin and an inorganic filler such as glass fiber, $SiO_2$, $TiO_2$, or $Al_2O_3$. Such a material allows for improving the mechanical strength, reducing the thermal expansion coefficient, and improving the light reflectance, of the substrate 1. For example, a glass fiber reinforced resin (glass epoxy resin) may be used as a material for the base member 1a.

At least the upper surface of the substrate 1 is electrically insulating. The substrate 1 may have a layered structure. For example, a metal plate on a surface of which an insulating layer is disposed may be used for the substrate 1. The substrate 1 may be a thin-film transistor (TFT) substrate including a plurality of TFTs.

The wiring layers 1b are disposed on a surface of the base member 1a and is electrically connected to a plurality of light sources 10. The material for the wiring layers 1b can be selected appropriately in accordance with a material of the base member 1a, a method of manufacturing the base member 1a, and the like. In the case where, for example, a ceramic is used for a material of the base member 1a, a high melting point metal with that can be sintered together with the ceramic for the base member 1a can be used for a material of the wiring layers 1b. The wiring layers 1b can be made of a high melting point metal such as tungsten and molybdenum. In the case where, for example, a glass epoxy resin is used for a material of the base member 1a, it is effective to select a material that is easy to process for a material of the wiring layers 1b. For example, a layer of metal such as copper or nickel, formed by plating, sputtering, vacuum evaporation, or application by pressing can be used for the wiring layers 1b. A metal layer having a predetermined wiring pattern can be formed by printing, photolithography, or the like.

The wiring layers 1b may have a multilayer structure. For example, the wiring layers 1b may include a pattern of a high melting point metal formed in the manner as described above and a metal layer formed on the pattern by plating, sputtering, vacuum evaporation, or the like and containing another metal, such as nickel, gold, or silver.

The substrate 1 may include the insulating member 2 on the wiring layers 1b. The insulating member 2 defines the openings 3 and covers regions of the wiring layers 1b other than regions each electrically connected to a respective one of the light sources 10 and other elements or the like. The insulating member 2 serves as a resist that insulates a region of the wiring layers 1b on which the light sources 10 or other elements or the like are not disposed.

For the insulating member 2, for example, a resin material such as epoxy resins, urethane resins, acrylic resins, polycarbonate resins, polyimide resins, oxetane resins, silicone resins, and modified silicone resins can be used. The insulating member 2 may be made of a material in which a light-reflective substance made of particles of an oxide, such as titanium oxide, aluminum oxide, or silicon oxide, is dispersed in a resin material. With a light-reflective insulating member 2 made of such a material and disposed on the wiring layers 1b, light emitted from the light sources 10 can be reflected on the upper surface of the substrate 1 to reduce the light from leaking and being absorbed on the substrate 1, so that the light extraction efficiency of the light-emitting device can be improved.

Light Source

A plurality of light sources 10 are disposed on the upper surface of the substrate 1. The light sources 10 are arranged one-dimensionally or two-dimensionally on the upper surface of the substrate 1. The light sources 10 are preferably arranged two-dimensionally along two directions perpendicular to each other, that is, along the x and y directions. Intervals $p_x$ in arrangement of the light sources 10 in the x direction differs from intervals $p_y$ in arrangement of the light sources 10 in the y direction. The arrangement of the light sources 10 is not limited to the example in FIG. 1.

The intervals in the x and y directions may be the same, or the x and y directions of the arrangement may not be perpendicular to each other. The intervals in the x and y directions may or may not be uniform. For example, the light sources 10 may be arranged such that the intervals between light sources widen from the center of the substrate 1 toward a periphery of the substrate. The expression "intervals between the light sources 10" refers to distances between an optical axis of each of the light sources 10 and an optical axis of adjacent ones of the light sources 10.

Each of the light sources 10 includes the light-emitting element 11 having an emitting surface. A known semiconductor light-emitting element can be used for the light-emitting element 11. In the present embodiment, a light-emitting diode is used for the light-emitting element 11 as an example. The light-emitting element 11 is configured to emit, for example, blue light. Alternatively, a light source configured to emit white light may be used for the light-emitting element 11. Light-emitting elements configured to emit light having different colors may be used for the light-emitting elements 11 of the light sources 10. For example, each of the plurality of light sources 10 may include light-emitting elements configured to emit respective one of red, blue, and green light to emit white light which is a mixture of the red, blue, and green light.

An element configured to emit light with any wavelength can be selected for the light-emitting element 11. Examples of an element configured to emit blue light and an element configured to emit green light include a light-emitting element for which a nitride semiconductor ($In_xAl_yGa_{1-x-y}N$, $0 \leq X$, $0 \leq Y$, $X+Y \leq 1$) or GaP is used. A light-emitting element containing a semiconductor such as GaAlAs or AlInGaP can be used for the element configured to emit red light.

Alternatively, semiconductor light-emitting elements made of materials other than the above-mentioned materials can be used. Various emission wavelength can be selected for of the light emitting element 11 in accordance with the materials of the semiconductor layers and mixing ratios thereof. The compositions, emission colors, sizes, and numbers of the light-emitting elements to be used may be selected appropriately in accordance with the purpose. In the present embodiment, an example an element configured to emit blue light is used for the light-emitting element 11, and the light source 10 is a light source that emits blue light.

Resin Unit

The resin member 12 covers the lateral surfaces of the light-emitting element 11 and does not cover the upper surface of the light-emitting element 11. The resin member 12 allows light laterally emitted from the light-emitting element 11 to be extracted upward. Examples of a matrix material of the resin member 12 include epoxy resins, silicone resins, mixtures of these resins, and light-transmissive materials such as glass. It is effective to select a silicone resin as the resin member 12 because of resistance to light and ease of formation of the resin member 12.

The resin member 12 may contain a diffusing member, a wavelength conversion member, and a coloring agent. Examples of the wavelength conversion member include YAG phosphors, β-SiAlON phosphors, and fluoride phosphors such as KSF phosphors. With the resin member 12 containing a β-SiAlON phosphor and a fluoride phosphor such as KSF phosphors as the wavelength conversion member, the color reproduction range of the light-emitting device can be widened. In the case where the resin member 12 contains the wavelength conversion member, it is effective that the light-emitting element 11 includes a nitride semiconductor ($In_xAl_yGa_{1-x-y}N$ $0 \leq X$, $0 \leq Y$, $X+Y \leq 1$) configured to emit light with a shorter wavelength that can efficiently excite the wavelength conversion member. Also, in the case where, for example, a blue light-emitting element is used, the resin member 12 may contain 60% by weight or more, preferably 90% by weight or more, of a KSF phosphor (which is a red phosphor) so that the light source 10 emits red light. That is, the resin member may contain a wavelength conversion member for emitting light having a predetermined color to allow the light source 10 to emit light having the predetermined color. The wavelength conversion member is not limited to be red phosphors, and any appropriate wavelength conversion member may be used. In the case where a light source 10 configured to emit red light is used, a phosphor sheet or the like is further used.

The resin member 12 can be formed by using a potting technique or the like to cover the lateral surfaces of the light-emitting element 11. In the case where the resin member 12 is formed by using a potting technique, the viscosity of a material of the resin member 12 is optimized to allow the shape of the resin member 12 to be controlled using surface tension of the material of the resin member 12. Examples of a technique of adjusting the viscosity of the material of the resin member 12 to obtain a desired viscosity includes, as well as adjusting the viscosity of the material of the resin member 12 itself, adding a light-diffusing member, a wavelength conversion member, or a coloring agent as described above to the material of the resin member itself.

Bonding Members

Each of the bonding members 7 fixes the light-emitting element 11 of a respective one of the light sources 10 to the wiring layers 1b. The bonding members 7 also serves to electrically connect the light-emitting element 11 to the wiring layers 1b. Examples of the bonding members 7 include Au-containing alloys, Ag-containing alloys, Pd-containing alloys, In-containing alloys, Pb—Pd-containing alloys, Au—Ga-containing alloys, Au—Sn-containing alloys, Sn-containing alloys, Sn—Cu-containing alloys, Sn—Cu—Ag-containing alloys, Au—Ge-containing alloys, Au—Si-containing alloys, Al-containing alloys, Cu—In-containing alloys, and mixtures of metals and fluxes.

Liquid, paste, or solid (sheet-shaped, block-shaped, powdered, or wire-shaped) members may be used for the bonding members 7. Appropriate members are selected for the bonding members 7 in accordance with the composition of the light-emitting element and the shape of the substrate. Each of the bonding members 7 may be made of a single member, or may be a combination of several types of members.

The light-emitting device according to the present disclosure can be used for, for example, a backlight device for a liquid-crystal display device.

What is claimed is:

1. A light-emitting device comprising:
a light-emitting device substrate;
at least one light source comprising:
a light-emitting element comprising:
a light-transmissive light-emitting element substrate,
a semiconductor layered structure that is attached to a lower surface of the light-emitting element substrate, and
a plurality of electrodes that are attached to a lower surface of the semiconductor layered structure and that face the light-emitting device substrate,
wherein the light emitting element has a rectangular shape in a plan view and has a length of 250 μm or less and a width of 250 μm or less, and
a light-transmissive resin member covering (i) lateral surfaces of the semiconductor layered structure, (ii) lateral surfaces of the plurality of electrodes, and (iii) lower portions of lateral surfaces of the light-emitting element substrate, and not covering (i) upper portions of the lateral surfaces of the light-emitting element substrate, and (ii) an upper surface of the light-emitting element,
wherein the upper surface of the light-emitting element is exposed so as to not be in contact with any member of the light-emitting device, and
wherein, in a directivity diagram of each of the at least one light source, which comprises a curve indicating an amount of light output from the light source with respect to an angle from an optical axis passing through a center of the light emitting element of the light source, a variation in light output of the light source in a range of −40° to 40° is 15% or less; and
an intermediate layer located above the at least one light source at a location spaced from the at least one light source, the intermediate layer comprising a diffuser and/or a phosphor sheet,
wherein an upper surface of the light-emitting device substrate is parallel to a lower surface of the intermediate layer, and
wherein the upper surface of the light-emitting element directly faces the lower surface of the intermediate layer with no intervening member between the upper surface of the light-emitting element and the lower surface of the intermediate layer.

2. The light-emitting device according to claim 1, wherein, in the directivity diagram of the light source, a variation in the light output of the light source in a range of −45° to 45° is 15% or less.

3. The light-emitting device according to claim 1, wherein a portion of the resin member is located at a position higher than a position of a light-emitting layer of the light-emitting element in a height direction.

4. The light-emitting device according to claim 1, wherein, in the directivity diagram of the light source, a slope a of a straight line y=ax+b connecting maximum and minimum values of y on the curve in a range of −15° to 15° is in a range of −0.3 to 0.3, where a and b are constants.

5. The light-emitting device according to claim 1, wherein the at least one light source comprises a plurality of light sources arranged two-dimensionally on the light-emitting device substrate.

6. The light-emitting device according to claim 5, wherein a variation in light output of the light sources in a range of −θ to θ satisfying tan(θ)=a/2b is 15% or less, where a represents a distance between the optical axis passing through a center of the light-emitting element of each of the light sources and the optical axis passing through a center of the light-emitting element of an adjacent one of the light sources, and where b represents a distance between the upper surface of the light-emitting element and the intermediate layer.

7. The light-emitting device according to claim 5, wherein the plurality of light sources are arranged so that intervals between the light sources increase from a center of the light-emitting device substrate toward a periphery of the substrate.

8. A light-emitting device comprising:
a light-emitting device substrate comprising:
a base member,
a plurality of wiring layers on an upper surface of the base member, and
an insulating member on an upper surface of the wiring layers, the insulating member containing a light-reflective substance and defining a plurality of openings in a plan view,
wherein a portion of an upper surface of each of the wiring layers is located at a bottom of a respective one of the plurality of openings;
a plurality of light sources, each of which is respectively mounted on the upper surface of the wiring layers at the bottom of a respective one of the openings, each of the light sources comprising:
a light-emitting element comprising:
a light-transmissive light-emitting element substrate,
a semiconductor layered structure that is attached to a lower surface of the light-emitting element substrate, and
a plurality of electrodes that are attached to a lower surface of the semiconductor layered structure and that face the light-emitting device substrate,
wherein the light emitting element has a rectangular shape in the plan view and has a length of 250 μm or less and a width of 250 μm or less, and
a light-transmissive resin member covering (i) lateral surfaces of the semiconductor layered structure, (ii) lateral surfaces of the plurality of electrodes, and (iii) lower portions of lateral surfaces of the light-emitting element substrate, and not covering (i) upper portions of the lateral surfaces of the light-emitting element substrate, and (ii) an upper surface of the light-emitting element,
wherein the upper surface of the light-emitting element is exposed so as to not be in contact with any member of the light-emitting device;
a bonding member bonding the light sources to the light-emitting device substrate; and
an intermediate layer located above the plurality of light sources at a location spaced from the light sources, the intermediate layer comprising a diffuser and/or a phosphor sheet,
wherein an upper surface of the light-emitting device substrate is parallel to a lower surface of the intermediate layer, and
wherein the upper surface of each light-emitting element directly faces the lower surface of the intermediate layer with no intervening member between the upper surface of the light-emitting element and the lower surface of the intermediate layer.

9. The light-emitting device according to claim 8, wherein a portion of the resin member is located at a position higher than a position of a light-emitting layer of the light-emitting element in a height direction.

10. The light-emitting device according to claim 8, wherein the intermediate layer comprises the diffuser and the phosphor sheet.

11. The light-emitting device according to claim 1, wherein the light-transmissive resin member is made of a resin material that is free of a diffusing member.

12. The light-emitting device according to claim 8, wherein the light-transmissive resin member is made of a resin material that is free of a diffusing member.

13. The light-emitting device according to claim 1, wherein the intermediate layer comprises the diffuser and the phosphor sheet.

\* \* \* \* \*